United States Patent
Ngai et al.

(10) Patent No.: US 6,281,704 B2
(45) Date of Patent: Aug. 28, 2001

(54) HIGH-PERFORMANCE INTERCONNECT

(75) Inventors: Tony Ngai, Campbell; Sergey Shumarayev, San Jose; Sammy Cheung, Pleasanton; Rakesh Patel, Cupertino; Vinson Chan, San Jose, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/810,116

(22) Filed: Mar. 15, 2001

Related U.S. Application Data

(63) Continuation of application No. 09/235,371, filed on Jan. 20, 1999.
(60) Provisional application No. 60/072,003, filed on Jan. 21, 1998.

(51) Int. Cl.$^7$ .................................................. H03K 19/177
(52) U.S. Cl. .............................. 326/41; 326/47; 326/101; 333/12
(58) Field of Search ................................. 326/41, 47, 101; 333/12, 243, 244; 257/503, 499

(56) References Cited

U.S. PATENT DOCUMENTS

| 5,223,751 | 6/1993 | Simmons et al. |
| 5,372,969 | 12/1994 | Moslehe. |
| 5,726,863 | * 3/1998 | Nakayama et al. ............... 361/794 |
| 5,872,462 | 2/1999 | Ditlow et al. |
| 5,952,846 | 9/1999 | Silver. |
| 6,025,740 | 2/2000 | Fukuyama. |

* cited by examiner

Primary Examiner—Michael Tokar
Assistant Examiner—Vibol Tan
(74) Attorney, Agent, or Firm—Townsend and Townsend and Crew LLP

(57) ABSTRACT

Techniques for providing high-performance interconnect for integrated circuits will improve overall integrated circuit performance. These techniques include arranging, laying out, and fabricating the signal conductors (e.g., 405, 720) so the parasitic coupling capacitances (e.g., 425) are minimized and parasitic resistance is reduced. The techniques will minimize effects of crosstalk noise between the conductors, and thus improve overall integrated circuit performance.

48 Claims, 12 Drawing Sheets

HIGH-PERFORMANCE INTERCONNECT

This application is a continuation of U.S. patent application Ser. No. 09/235,371, filed Jan. 20, 1999, which claims the benefit of U.S. provisional application No. 60/072,003, filed Jan. 21, 1998, which are incorporated by reference.

BACKGROUND OF THE INVENTION

The present invention relates to the field of integrated circuits. More specifically, the present invention provides techniques and circuitry for reducing parasitics, crosstalk, noise, and other similar properties when propagating signals on the interconnect lines of an integrated circuit, which will improve the performance and reliability of the integrated circuit.

In an electronic circuit, such as a integrated circuit or printed circuit board, there are many interconnections between the various circuits and devices. These interconnections or interconnect lines may be made using wires, conductive interconnect layers, metal lines, polysilicon lines, polysilicide lines, and diffusion layers, just to name a few. To allow for efficient layout of the integrated circuits, interconnect lines are typically grouped together and run adjacent to another, or organized in a bus structure.

Various types of integrated circuits, all of which use interconnect lines, include microprocessors, static random access memories (SRAMs), erasable-programmable read only memories (EPROMs), electrically erasable programmable read only memories (EEPROMs), Flash EEPROM memories, programmable logic devices (PLDs), field programmable gate arrays (FPGAs), application specific integrated circuits (ASICs), among others.

In particular, PLDs are well known to those in the electronic art. Such programmable logic devices are commonly referred as PALs (Programmable Array Logic), PLAs (Programmable Logic Arrays), FPLAs, PLDs, EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application. Such devices include, for example, the well-known, Classic™, and MAX® 5000, MAX® 7000, and FLEX® 8000, FLEX® 10K programmable integrated circuits made by Altera Corp.

PLDs are generally known in which many logic array blocks (LABs) are provided in a two-dimensional array. LABs contain a number of individual programmable logic elements (LEs) which provide relatively elementary logic functions such as NAND, NOR, and exclusive OR. Further, PLDs have an array of intersecting signal conductors for programmably selecting and conducting logic signals to, from, and between the LABs and LEs. As can be appreciated, many interconnect lines are used to facilitate the interconnections between the various logical features. Interconnect are conductors on the integrated circuit which are used to wire and connect together the devices, gates, transistors, logical blocks, pads, and other components. As integrated circuits become larger and denser, there will be greater numbers of interconnect lines per integrated circuit. It becomes increasingly important to improve the techniques and architectures used for interconnecting the elements and routing signals between the logic blocks. The performance of the integrated circuit depends in part on the performance of the signals through the interconnect lines.

An example of one factor that reduces the performance (and may also affect the functional reliability of the logical circuitry) of the interconnect is crosstalk or cross-coupling between the interconnect lines. In particular, crosstalk interference glitches which may occur on rising and falling edges of the main signal are amplified by the receiving buffer if these glitches arc in the high gain region of that buffer. This effect may lead to double clocking, which would create logical errors in the function circuitry. Further, the performance of the interconnect lines may also be slower because of the increased propagation delay due to the crosstalk.

These problems and concerns will become more significant as it becomes possible to fabricate denser integrated circuits. With increased microminiaturization, interconnect wires on the integrated circuit will be closer together. According to wellknown physics principles, a shorter distance between the interconnect leads to an increase the capacitance between the interconnect lines. An increased capacitance between the interconnect lines increases the crosstalk or cross-coupling between the interconnect lines.

As can be seen, improved techniques and circuitry for interconnecting signal lines are needed, especially techniques for improving interconnect lines and their use to provide improved performance and greater integrity and reliability.

SUMMARY OF THE INVENTION

The present invention provides various techniques for improving the performance of interconnect lines and conductors on an integrated circuit. These techniques include arranging, laying out, and fabricating the signal conductors so the parasitic coupling capacitances are minimized and parasitic resistance is reduced.

The interconnect may be implemented using multiple layers or levels of conductive material. Signal conductors may be interleaved with shielding conductors to reduce cross-coupling between signal lines. Signal conductors are arranged and positioned to minimize the length at which two signal conductors are run in parallel to another, and in relatively close proximity. For example, signal conductors in a first layer are not positioned on top of or beneath other signal conductors in a different layer. Conductors are widened as possible to reduce resistance.

The conductive material to implement the interconnect may include aluminum and copper conductors. Low k dielectrics may be used between the conductors to minimize parasitic capacitances.

Further techniques to provide high-performance interconnect include line segmentation where a signal line is divided into multiple line segments. Between the line segments, there are unidirectional or bidirectional buffers to provide greater signal drive capability.

Glitch filtering buffers may be used at the input to the logic circuits such as LABs and LEs. Cross-coupling between the signal lines may produce glitches. Glitches may cause effects such as double clocking which would lead to functional errors.

The glitch filtering buffers would minimize the effects of these glitches, and ensure the logical functionality is not disturbed improperly.

In an embodiment, the invention is an integrated circuit including a first level of interconnect conductors having a first signal conductor; and a second level of interconnect conductors having a second signal conductor and a shielding conductor, where the second signal conductor is formed adjacent to the shielding conductor, and the shielding conductor is formed above the first signal conductor.

Furthermore, there may be a third signal conductor in the second level that is formed adjacent to the shielding conductor. This third signal conductor would not be directly above the first signal conductor.

In another embodiment, the invention is an integrated circuit including a first and second level of interconnect conductors, where the second level is formed above the first level. The interconnect conductors in the first level are formed on top of interconnect conductors in the second level, where shielding conductors in the second level are on top of signal conductors in the first level, and signal conductors in the second level are on top of shielding conductors in the first level.

In a further embodiment, the invention is an integrated circuit including interconnect lines; logical circuits to receive signals via the interconnect lines; and a buffer, connected between one of the interconnect lines and one of logical circuits. The buffer filters glitches in signals received from the interconnect lines. The glitch filter may include a first transistor and second transistor connected between a first and second voltage supply, and a third transistor having a control electrode connected to a node between the first and second transistors. The third transistor is connected between one of the voltage supplies and control electrodes of the first and second transistors.

In a still further embodiment of the present invention, the integrated circuit includes an interconnect line, divided into a number of segments connected in series, where between each segment is a bidirectional buffer with glitch filtering. The interconnect line may be formed using copper material to reduce resistance.

In another aspect of the invention, the integrated circuit includes a first layer having a first space, a first conductor, and a second space, formed adjacent another.

There is a second layer, above or below the first layer, having a second conductor, a third space, a third conductor, and a fourth space, formed adjacent another. The second conductor has a width approximately equal to or less than a width of the first space, and a sum of widths of the third space, third conductor, and fourth space is about equal to a width of the first conductor.

In still another aspect, the integrated circuit includes a first layer having a first space, a first conductor, a second space, a second conductor, and a third space, formed adjacent to another. There is a second layer, above or below the first layer, comprising a third conductor, a fourth space, a fourth conductor, a fifth space, and a fifth conductor, formed adjacent to another, where a width of the third conductor is about equal to a width of the first space, and a sum of the widths of the fourth space and fourth conductor are about equal to a width of the first conductor.

Other objects, features, and advantages of the present invention will become apparent upon consideration of the following detailed description and the accompanying drawings, in which like reference designations represent like features throughout the figures.

DETAILED DESCRIPTION

Figure 1:
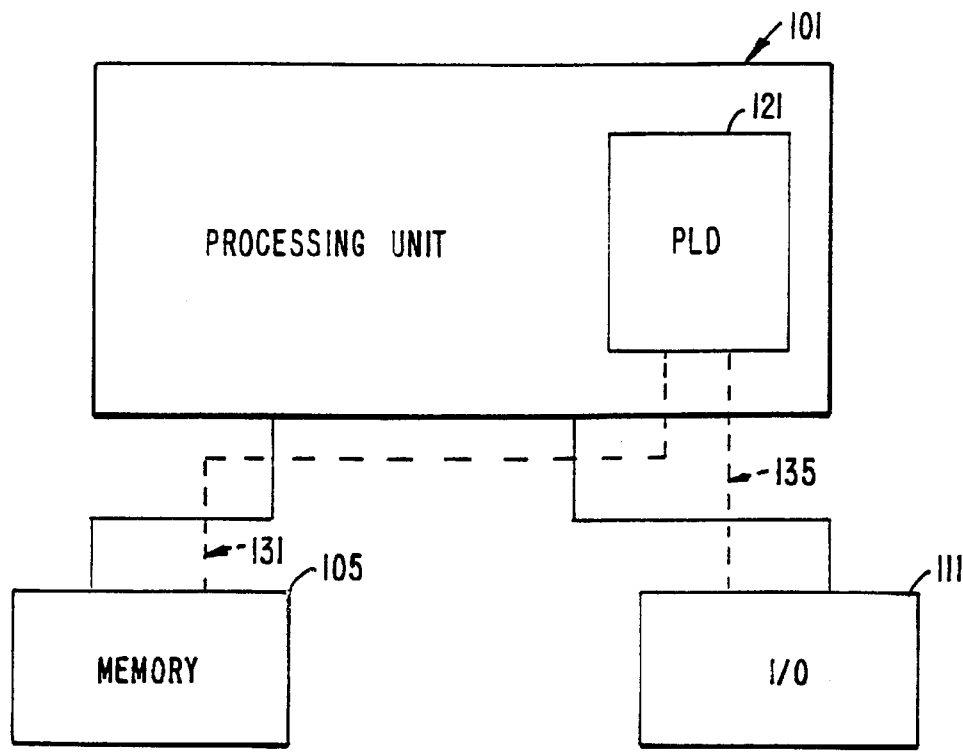
FIG. 1 shows a block diagram of a digital system.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices (sometimes referred to as a PALs, PLAs, FPLAs, PLDs, CPLDs, EPLDs, EEPLDs, LCAs, or FPGAs), are well known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, which is incorporated by reference for all purposes. Such devices are currently represented by, for example, Altera's MAX® series of devices and FLEX® series of devices. The former are described in, for example, U.S. Pat. No. 5,241,224 and 4,871,930, and the Altera Data Book, June 1996, which are all incorporated by reference in their entirety for all purposes. The latter are described in, for example, U.S. Pat. Nos. 5,258,668, 5,260,610, 5,260,611, and 5,436,575, and the Altera Data Book, June 1996, which are all incorporated by reference in their entirety for all purposes. Logic devices and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
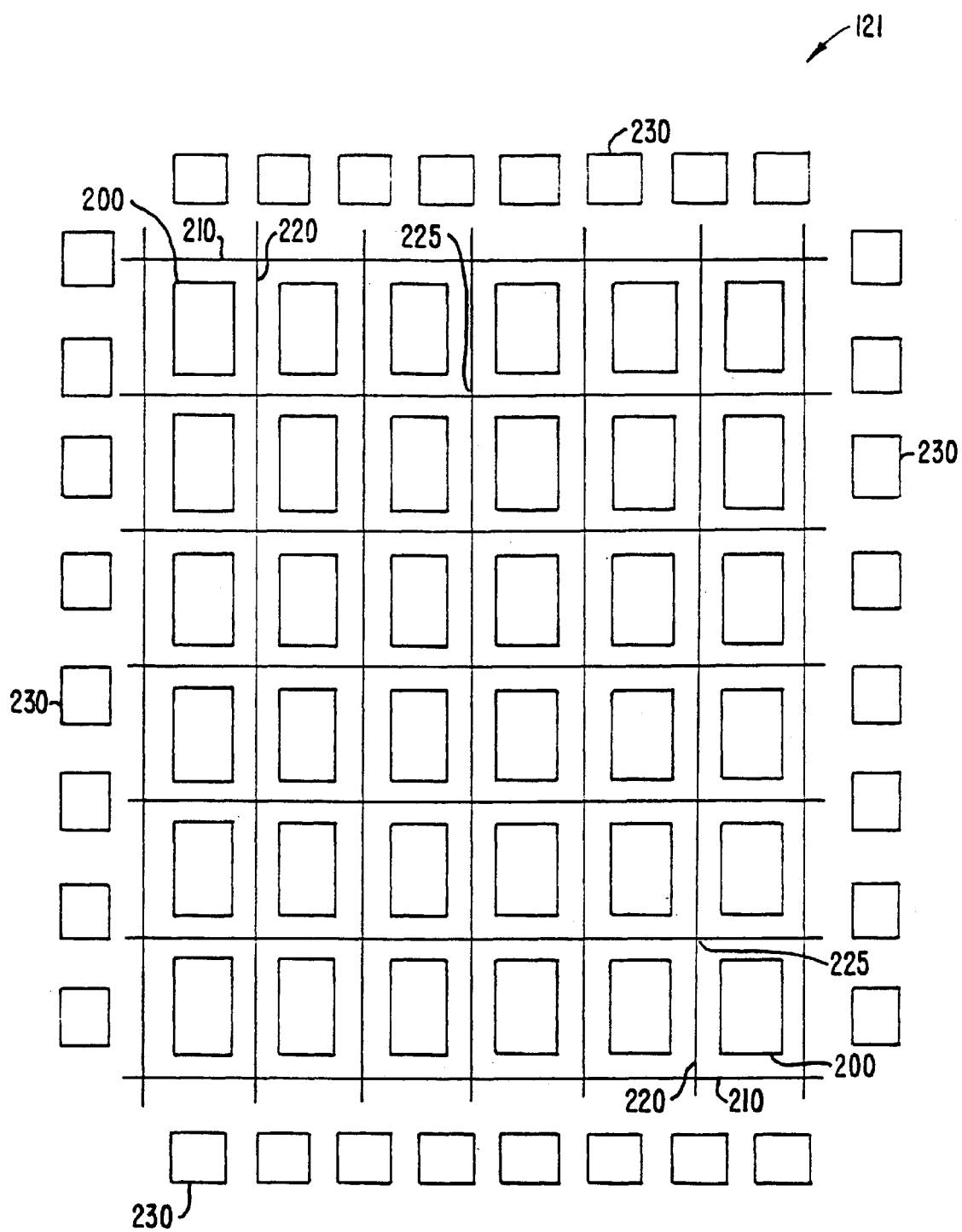
FIG. 2 is a simplified block diagram of an overall internal architecture and organization of a PLD.

FIG. 2 is a simplified block diagram of an overall internal architecture and organization of PLD 121 of FIG. 1. Many details of PLD architecture, organization, and circuit design arc not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than shown in PLD 121 of FIG. 2. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver.

Figure 3:
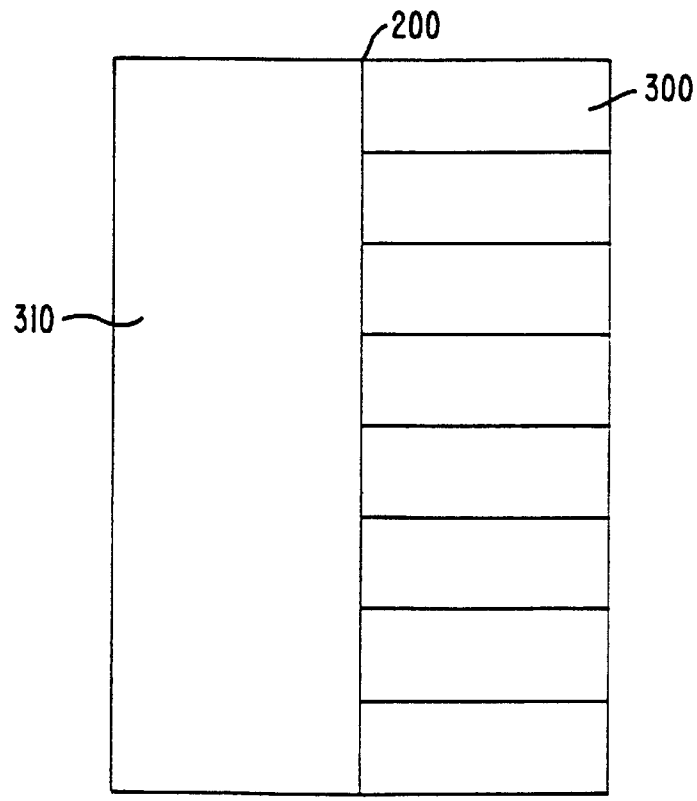
FIG. 3 shows a simplified block diagram of LAB.

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator such as a look-up table that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

The signals on an integrated circuit such as a PLD are propagated and connected using interconnect. For example, in a PLD, the GVs, GHs, local interconnect, and other signal routings are implemented using such interconnect. Interconnect lines are typically fabricated using aluminum conductors, although interconnect may also be fabricated using polysilicon, polysilicide, and diffusion, just to name a few examples.

Figure 4:
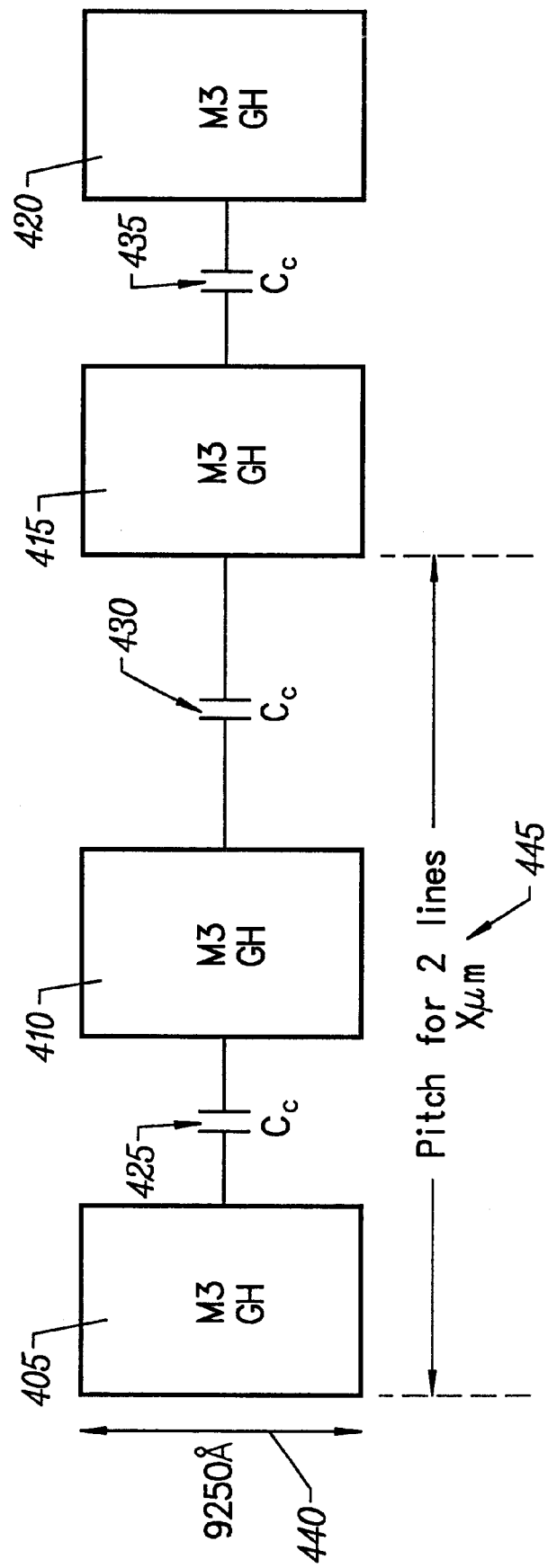
FIG. 4 shows a cross-section of several interconnect lines arranged in a single level.

FIG. 4 shows a front cross-section of interconnect lines 405, 410, 415, and 420 run in metal-3 on an integrated circuit. The interconnect links are formed on a substrate such as silicon or SOI. In FIG. 4, the conductors are used to run GH lines, such as on a PLD; however, FIG. 4 is also representative of typical interconnect lines on the integrated circuit used to conduct any electrical signals. Although only four lines are shown, it is understood that integrated circuits have many interconnect lines and conductors. For example, a typical PLD may have 10,000 or more interconnect lines. Interconnect lines may also be run in other layers of metal including metal-1, metal-2, metal-4, metal-5, and so forth, depending on availability in the particular process technology.

A typical thickness 440 for the conductors used to implement interconnect lines is about 9250 Angstroms. A typical pitch 445 for two lines is about 3.1 microns. A typical width for the conductors is about 0.9 microns. A typical spacing between conductors 405 and 410, and conductors 415 and 420 is about 0.8 microns. A typical spacing between conductors 410 and 415 is about 1.4 microns. The spacing between conductors 410 and 415 is slightly wider to allow for the making of contacts for connections to either conductor 410 and 415. The dimensions stated in this specification are for reference and comparison purposes only. It is understood that exact dimensions may vary since, for example, as process technologies improve, dimensions will likely shrink.

There is coupling capacitance between the interconnect lines. For example, there is a coupling capacitance 425 between conductors 405 and 410. Conductor 415 has coupling capacitances 430 and 435. The capacitances 425, 430, and 435 are parasitic capacitances. The specific values of these capacitances depends on the distance and dielectric material between conductors. Further, these capacitances are distributed for the length of the conductor.

The coupling capacitances are responsible for crosstalk and coupling of signals between the lines. For example, a pulse signal on conductor 405 may be coupled through capacitance 425 onto conductor 410. The greater the value of the capacitance, the greater the coupling is between the conductors. To minimize crosstalk noise, the values of the parasitic coupling capacitors should be minimized.

Figure 5:
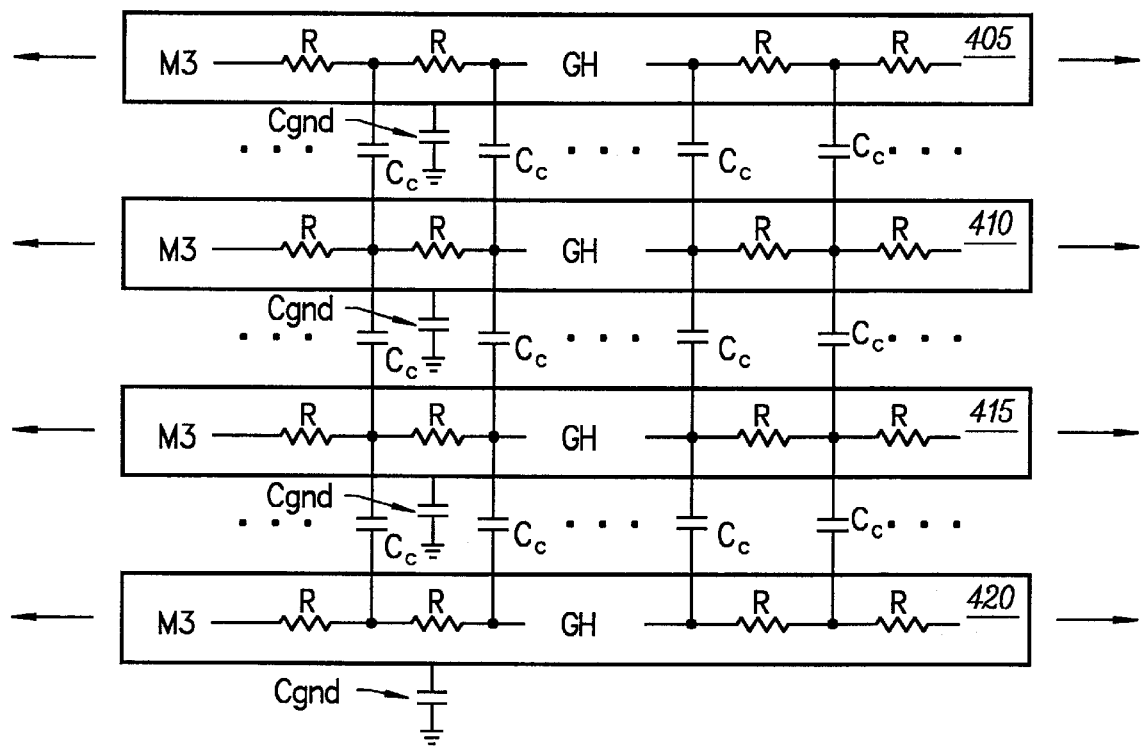
FIG. 5 shows a top view of several interconnect lines.

FIG. 5 shows a top view of the four GH interconnect lines. Interconnect lines on the integrated circuit may be of any length. The interconnect lines may be run long distances, possibly the entire length of the integrated circuit or "snaked" throughout the integrated circuit. As shown in FIG. 5, interconnect lines form a distributed RC network. R is the resistance distributed for the length the conductor. The capacitances C include the parasitic coupling capacitances $C_c$ discussed above and distributed parasitic capacitances to ground $C^{GND}$.

There is an RC propagation delay when passing signals through the RC network. This delay is given by:

$$R*(C_c+C_{GND}). \quad (1)$$

Furthermore, there may be a delay push-out from crosstalk noise due to the parasitic capacitances which is proportional to:

$$C_c/(C_{GND}+C_c). \quad (2)$$

Figure 6:
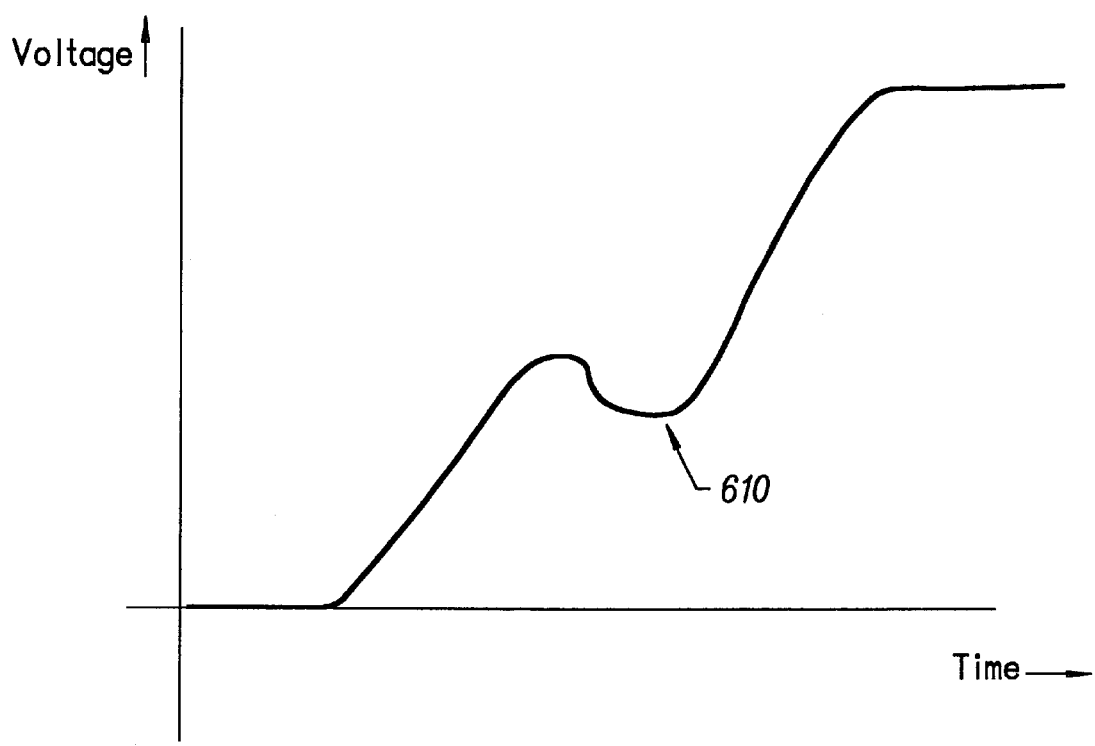
FIG. 6 shows a timing diagram for low-to-high signal transition having a glitch.

The delay push-out may result from a delay in the edge transition time or a disruption or glitch in the edge transition. For example, FIG. 6 shows a low-to-high transition with a glitch 610. A similar glitch as shown in FIG. 6 would also occur on a high-to-low transition. Glitch 610 negatively affects the transient performance of the circuitry by stretching out the rise time. Further, glitch 610 may also cause functional errors such as double clocking, which would be undesirable. Therefore, the performance of an integrated circuit is determined in part by the performance characteristics of the interconnect.

As can be seen from the above equation, the delay push-out may be minimized by reducing the coupling capacitance or increasing the capacitance to ground, or both. This would reduce the above ratio for the delay push-out. However, it is generally undesirable to increase the capacitance to ground too much since this decreases performance (because $C_{GND}$ is still a component in the RC delay (see above equation (1) for RC delay).

Figure 7:
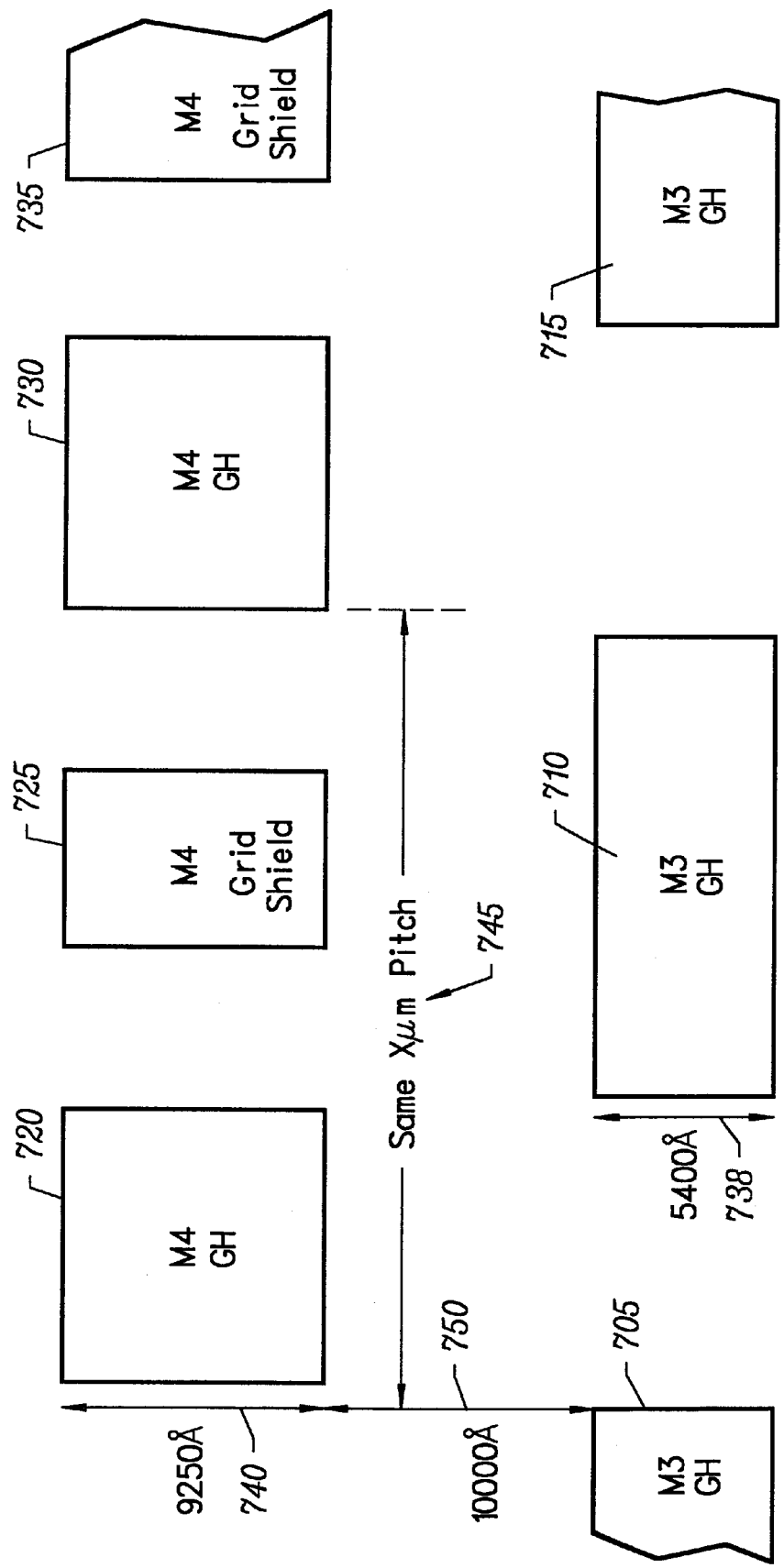
FIG. 7 shows a cross-section of a layout of interconnect lines for minimizing cross-coupling effects arranged in multiple levels.

FIG. 7 shows a front cross-section of an arrangement of interconnect lines with improved performance characteristics. In the specific embodiment of FIG. 7, two layers of metal conductors are used. Conductors 705, 710, and 715 are in a first layer, and conductors 720, 725, 730, and 735 are in a second layer, above the first layer. Both first and second layers are formed on a semiconductor substrate such as silicon or SOI. Furthermore an alternative embodiment may swap the first and second layers, where the first layer is above the second layer. It is understood this arrangement would provide the same or similar crosstalk and noise reduction benefits. In this specific embodiment, conductors in the first layer are run in metal-3 while conductors in the second layer are run in metal-4. In further embodiments of the present invention, there may be even more layers of metal, more than two, depending on the process technology used. The structure may involve three or more layers of conductors. For example, the structure may involve metal-3, metal-4, metal-5, and possibly other layers. Also, the layers may include metal-1 and metal-2, as well as conductive layers other than metal.

A typically thickness 738 of the conductors in the first level is about 5400 Angstroms. A typical thickness 740 of the conductors in the second level is about 9250 Angstroms. The first layer of conductors is separated from the second layer of conductors by a distance 750 of about 10,000 Angstroms. A pitch 745 for two lines is as indicated in FIG. 7. This pitch is the same as that shown for FIG. 4, and can be used to compare the layout cross-sections in FIGS. 4 and 7.

For comparison purposes, as compared to FIG. 4, a width of signal conductors 720 and 730 in the second level is about 1.4 microns and shielding conductors 725 and 735 are about 0.9 microns. A spacing between signal conductor 720 and shielding conductor 725 is about 0.85 microns. A width of conductors 705, 710, and 715 in the first level is about 2.4 microns, and a spacing between these conductors is about 1.6 microns.

In FIG. 7, conductors 705, 710, 715, 720 and 730 are used to run GH lines or other signals. Conductors 725 and 735 in the second level are used to run a fixed voltage such as VSS or ground (i.e., a ground shield) or VCC, or another voltage. FIG. 7 shows the embodiment where conductors 725 and 735 are ground shields. Conductors 725 and 735 may be referred to as shielding conductors while conductors 705, 710, 715, 720, and 730 may be referred to as signal conductors.

In the layout of the interconnect in FIG. 7, signal conductors are interleaved with shielding conductors minimize cross-coupling noise and provide greater performance. Specifically, as compared to the embodiment of FIG. 4, the parasitic coupling capacitance between signal conductors is minimized.

As an example, signal conductor 720 has a parasitic coupling capacitance to signal conductors 705 and 710. However, the magnitude of these capacitances would be less than those in FIG. 4 because the distance separating the signal conductors is greater for configurations in FIG. 7. In FIG. 4, the metal lines are spaced apart from one another at 0.8 microns and 1.4 microns. In contrast, in FIG. 7, signal conductor 720 is separated from signal conductors 705 and 710 in the first layer by at least 10,000 Angstroms (or 1 micron). Therefore, overall, the embodiment in FIG. 7 has less coupling capacitance.

Moreover, signal conductor 720 is positioned so it runs above the spacing or gap between signal conductors 705 and 710. This minimizes the area of any parasitic capacitance between conductors 720 to 705 and conductors 720 to 710, and further reduces the coupling capacitance.

Ground shield 725 separates conductors 720 and 730, and effectively cuts off any coupling capacitance between the two conductors. Since conductor 720 runs adjacent to ground shield 725, this increases parasitic capacitance to ground, which reduces the day push-out due to the relationship between the parasitic capacitances to the performance of the interconnect discussed above. As can be seen from the equations, although a larger parasitic capacitance to ground may increase the RC delay, a larger capacitance to ground also will reduces the delay push-out or crosstalk or cross-coupling noise. For comparison purposes, for example, the extra delay or delay push-out caused by cross-coupling noise for the layout in FIG. 4 may be about 5 nanoseconds while for the layout in FIG. 70, the delay will be about 1 nanosecond. Overall, the performance of interconnect will improve because of the improved layout shown in FIG. 7.

The parasitic coupling capacitances will also be reduced for signal conductors in the first level. For example, the spacing separating conductors 705 and 710 is about 1.6 microns. This is wider than the spacing between conductors in FIG. 4, which is about 0.8 microns or 1.4 microns, depending on which conductor. Thus, the arrangement in FIG. 7 reduces the coupling capacitance between conductors 710 and 705. Also, since conductors 705 and 710 are not run beneath (or below) another signal conductor, this will minimize the area of any coupling capacitance to signal conductors in the second level: Signal conductor 710 is separated from conductors 720 and 730 by at least 10,000 Angstroms or 1 micron. Ground shield 725 is run above conductor 710, and this arrangement tends to reduce the delay push-out as discussed above.

Furthermore, signal conducts in FIG. 7 are wider than corresponding conductors in FIG. 4. Conductor 710 is widened to about 2.4 microns (compared to about 0.9 microns for corresponding conductor 410) so that it extends from beneath an edge of conductor 720 to beneath an edge of conductor 730. By providing a wider conductor 710, its resistance is reduced, and with lower resistance, the parasitic RC delay is further reduced. Conductors 720 are 730 (about 1.4 microns) are also wider than similar conductors 405 and 415 (about 0.9 microns). The length of a conductor depends the how far the particular signal is routed. For example, a GH line may run the entire length and possibly serpentine throughout various components on an integrated circuit, and this will also be true of the conductor used to implement this GH line.

Although the various conductors for a particular layer are shown to be the same width, depending on the specific embodiment, there may be variations in the widths of conductors within the same layer. For example, one conductor in the first layer may be 3 microns wide, while another conductor in the first layer may be 2.2 microns wide.

Another technique that may be used to decrease the resistance of the conductors or interconnect lines is to increase their height. Instead of a thickness of 9250 Angstroms, the conductors may be for example 10,000 Angstroms, 11,000 Angstroms, 12,000 Angstroms, or even greater. This has the same effect as widening the conductors discussed above. Increasing the dielectric distance separating the conductive layers will reduce the coupling capacitances. Instead of 10,000 Angstroms, the distance may be 12,000 Angstroms, 15,000 Angstroms, or even greater.

In the same pitch 745 for two lines as in FIG. 4, the organization of FIG. 7 also has two conductors line. The X-Y dimensions of the layout in FIG. 7 should be about the same as for FIG. 5. Thus, the present invention provides an improved interconnect structure by using multiple levels of conductors, and without impacting the X-Y dimensions of the integrated circuit. These techniques are especially applicable to integrated circuits having large numbers of interconnect such as PLDs, ASICs, and microprocessors.

The performance of the interconnect structure may be further improved by using low k dielectric between the conductors and also lower resistance conductors (such as copper interconnect). By using a low k dielectric (such as teflon, or oxides or other materials containing fluorine), this reduces the magnitude of the parasitic capacitances, especially those between the conductors. A low k dielectric would have a dielectric constant k that is less than for silicon oxide, which is typically used as an insulating material in many semiconductor processes.

Conductors are often typically fabricated using aluminum conductors. However, copper has a lower resistivity than aluminum, and using copper for the interconnect will reduce the resistance of the interconnect. Lower resistance conductors made of materials such as copper will improve the performance of the interconnect because the parasitic RC delay is reduced. The use of copper interconnect may also reduce the effects of electromigration, which would increase device longevity. By using both low k dielectric materials and low resistance interconnect (such as copper interconnect), the performance of the interconnect can be further improved. Since the performance of the interconnect determine in part the performance of PLDs, the use low k dielectrics and copper interconnect in PLDs will increase their performance for the reasons as explained (and given by the equations above).

For example, to further improve performance by reducing interconnect resistance, conductors 405, 410, 415, 420, 705, 710, 715, 720, 725, 730, and 735 in FIGS. 4 and 7 may be fabricated using copper interconnect. And, to reduce coupling capacitances, the insulator between (i.e., above, below, surrounding, etc.) the conductors in FIGS. 4 and 7 may be fabricated using a low k dielectric.

Figure 8:
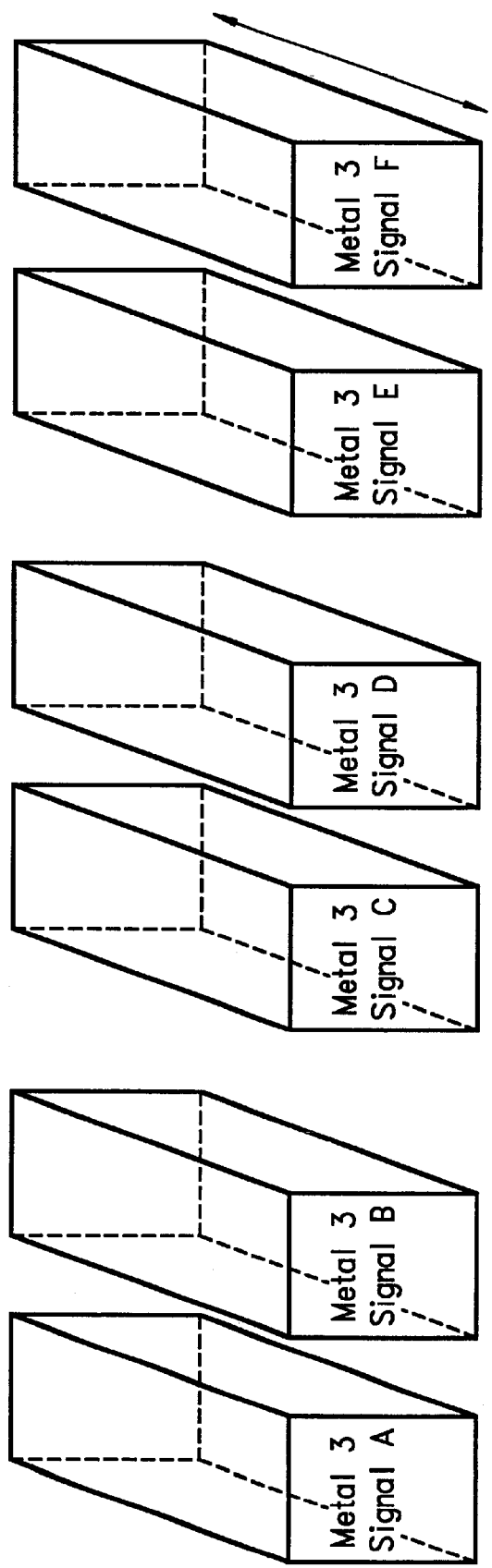
FIG. 8 shows a three-dimensional perspective of the arrangement of interconnect lines of FIG. 5.
Figure 9:
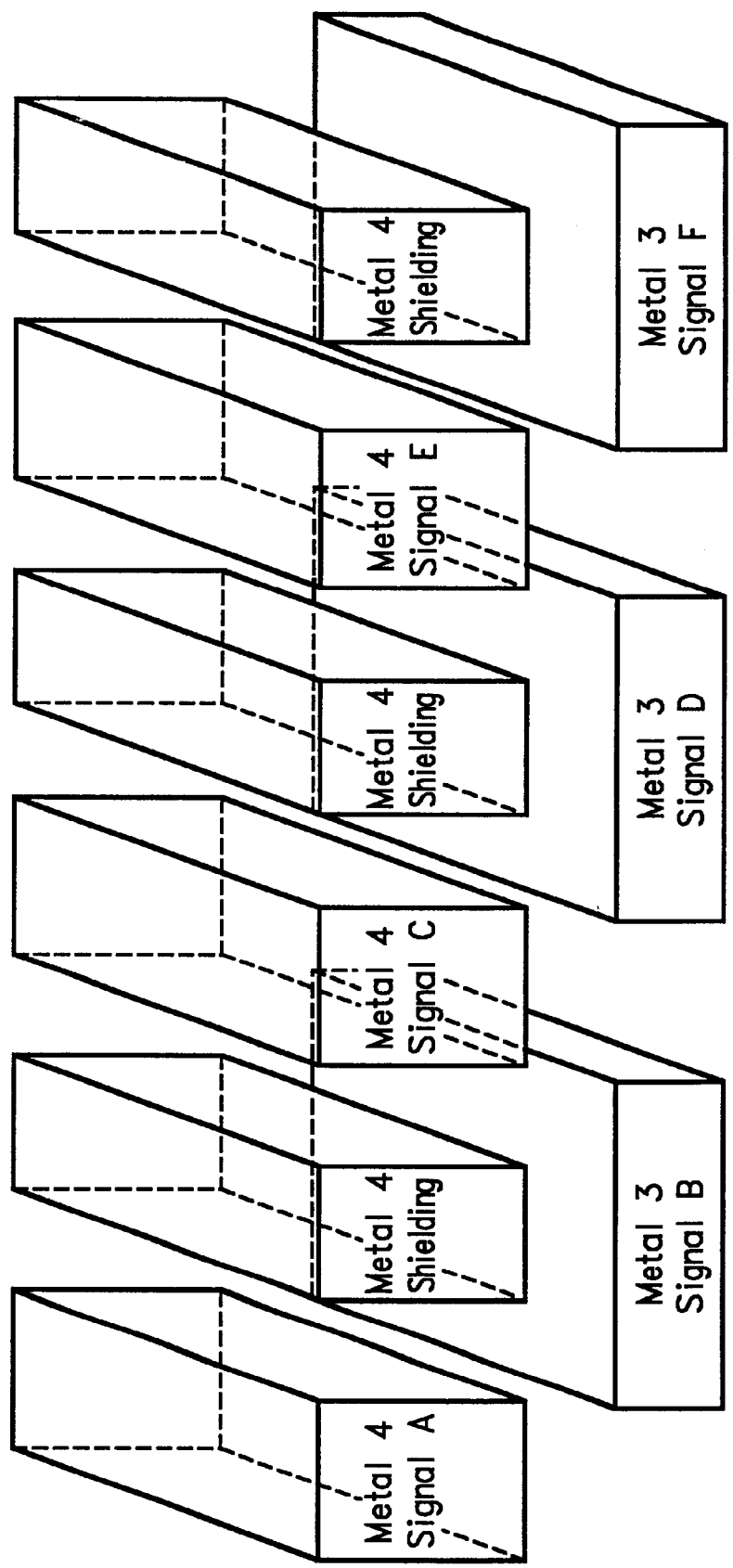
FIG. 9 shows a three-dimensional perspective of the arrangement of interconnect lines of FIG. 7.

FIGS. 8 and 9 show three-dimensional perspective views for FIGS. 4 and 7, respectively.

Figure 10:
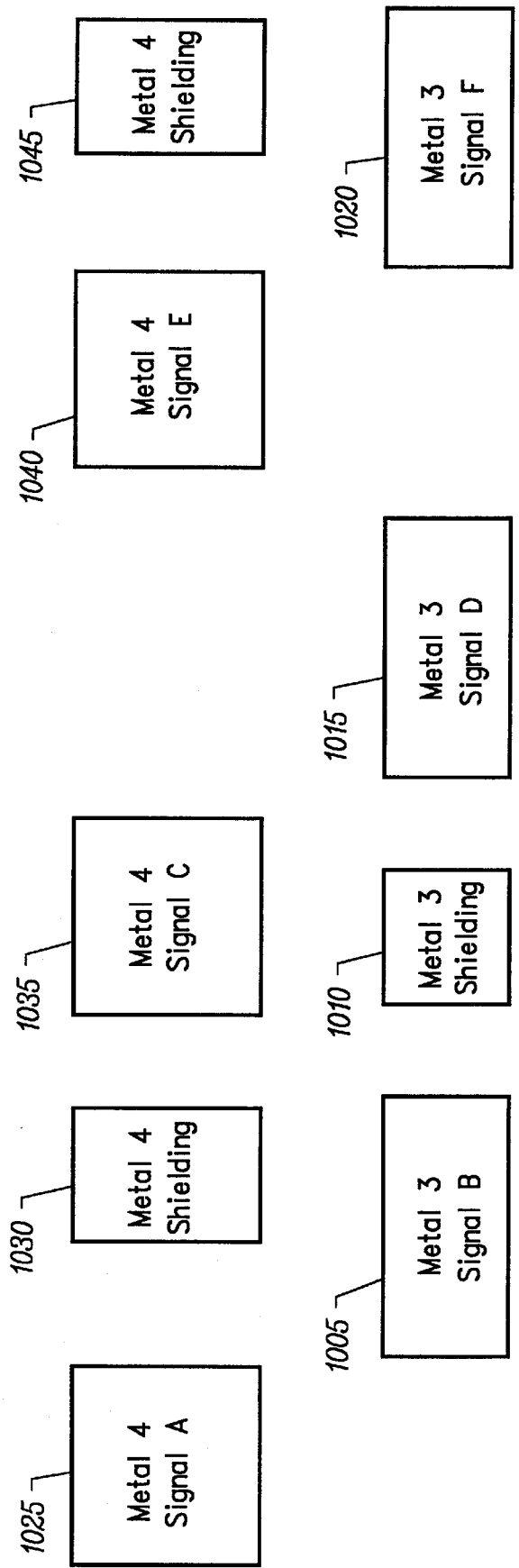
FIG. 10 shows a cross-section of interconnect lines in a multiple-level implementation with single shielding on multiple levels.

FIG. 10 shows a further embodiment of the present invention with single shielding on both first and second levels. Similar to the discussion for FIG. 7 above, the arrangement of the conductors minimizes crosstalk and noise between the signal conductors. The first layer and second layer may be interchanged (i.e., the first layer may be above the second layer) and provide similar crosstalk and noise reduction. In FIG. 10, conductors 1005, 1010, 1015, and 1020 are in a first layer of conductors above the substrate. Conductors 1005, 1015, and 1020 are signal conductors while conductor 1010 is a shielding conductor. The shielding conductor typically carries a fixed voltage such as VSS or VDD.

Conductors 1025, 1030, 1035, 1040, and 1045 are in a second layer of conductors, above the first layer. Conductors 1025, 1035, and 1040 are signal conductors while conductors 1030 and 1045 are shielding conductors. The second layer conductors are run in metal-4 and the first layer conductors are run in metal-3 for the specific embodiment in FIG. 10.

To minimize coupling capacitance, conductors in second layer are positioned so that there is no signal conductor which run in parallel directly below or beneath in the first layer. In particular, no signal conductor is in the first layer below conductor 1025 in the second layer. Adjacent to conductor 1025 is a shield conductor 1030. Signal conductor 1005 is positioned below shield conductor 1030, and its width extends from a point beneath about an edge of conductor 1025 to a point beneath about an edge of conductor 1030.

Adjacent to signal conductor 1005 is shielding conductor 1010. Signal conductor 1035 of the second level is run directly above the shielding conductor 1010. A width of signal conductor 1035 extends from about an edge of conductor 1010 to about an edge of conductor 1015.

Signal conductor 1015 in the first level extends from about an edge of conductor 1035 to and an edge of conductor 1040. Although no shielding conductor is shown above conductor 1015 in FIG. 10, specific embodiments of the present invention may include such a shielding conductor in the second level.

Signal conductor 1040 of the second level extends form about an edge of conductor 1015 to an edge of conductor 1020. Although no shielding conductor is shown below conductor 1040 in FIG. 10, specific embodiments of the present invention may include such a shielding conductor in the first level. The spacing between conductors 1035 and 1040, and between 1015 and 1020, may be used to make contacts to interconnect the conductors to the various circuits.

Signal conductor 1020 extends from about an edge of conductor 1040 to about an edge of shield conductor 1045. Shield conductor 1045 is run in the second level directly above conductor 1020.

The embodiment of the present invention in FIG. 10 reduces crosstalk noise and improves performance because the arrangement of the conductors reduces the parasitic coupling capacitances, for similar reasons as discussed for FIG. 7.

Furthermore, the width of signal conductors in FIG. 10 are wider than signal conductors in FIG. 4 which reduces the parasitic resistance.

Overall, the arrangement of interconnect conductors in FIG. 10 improves performance because of a reduction in parasitic coupling capacitance and resistance.

Figure 11:
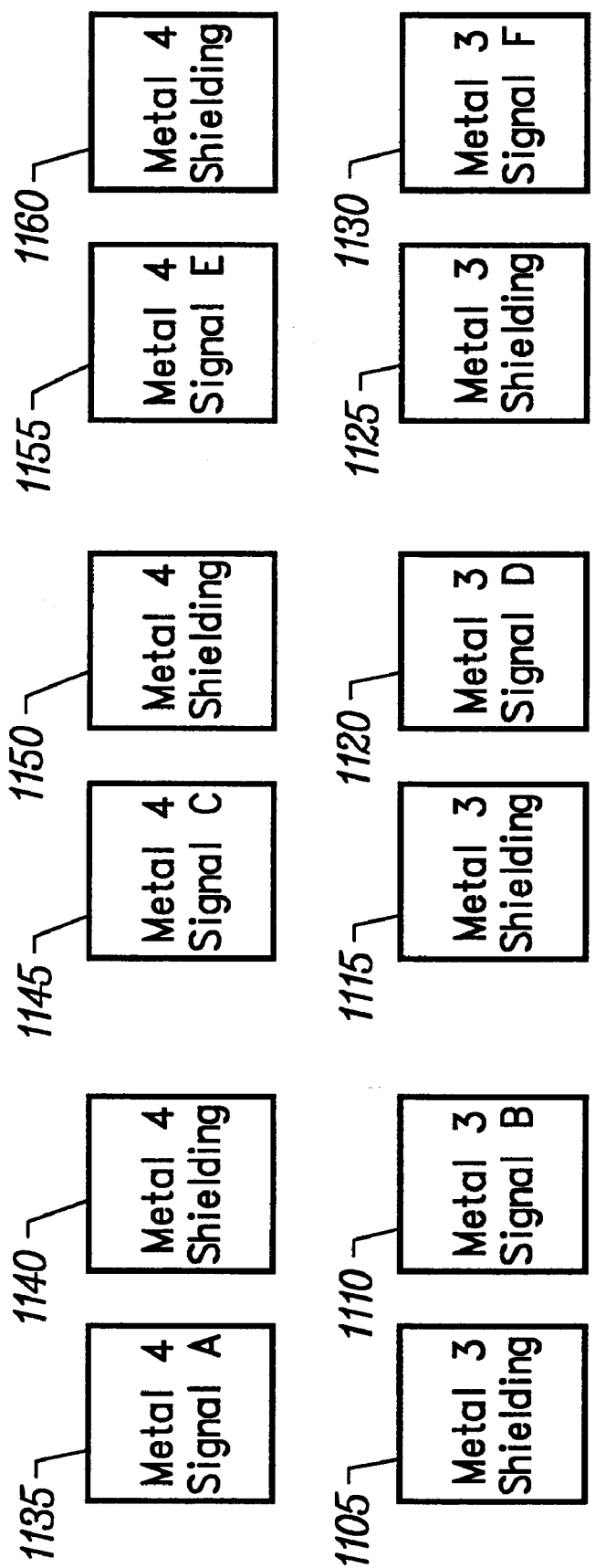
FIG. 11 shows a cross-section of interconnect lines in a multiple-level implementation with double shielding on multiple levels.

FIG. 11 shows a further embodiment of the present invention with double shielding on both first and second levels. This figure shows a front cross section of the conductors. Similar to the discussions for FIGS. 7 and 10 above, the arrangement of the conductors minimizes crosstalk and noise between the signal conductors. In FIG. 11, conductors 1105, 1110, 1115, 1120, 1125, and 1130 are in a first layer of conductors above the substrate. Conductors 1110, 1120, and 1130 are signal conductors while conductor 1105, 1115, and 1125 are shielding conductors. The shielding conductors typically carry voltages such as VSS or VDD, or another reference voltage or potential.

Conductors 1135, 1140, 1145, 1150, 1155, and 1160 are in a second layer of conductors, above the first layer. Conductors 1025, 1035, and 1040 are signal conductors while conductors 1030 and 1045 are shielding conductors. The second layer conductors are run in metal-4 and the first layer conductors are run in metal-3 for the specific embodiment in FIG. 11.

Within each layer, each signal conductor is adjacent to at least one shielding conductor. More specifically, signal conductors are run so that every two signal conductors are separated by at least one shielding conductor. Or, in other words, signal conductors are run alternating with shielding conductors. The shielding conductor minimizes the parasitic coupling capacitances between two lines in the same layer. For example, in the second layer, conductors 1135, 1145, and 1155 are run alternating with shielding conductors 1140, 1150, and 1160. The conductor on the end of a series or group of conductors may be a shielding conductor or a signal conductor.

In different layers (e.g., metal-3 and metal-4 layers), conductors in the upper layer are run in parallel, and "on top" of conductors in the lower layer. Coupling capacitance is minimized by arranging the conductors so that a signal conductor is above a shield conductor, and a shield conductor is above a signal conductor. By arranging the conductors as shown in FIG. 11, coupling capacitances are minimized for similar reasons as discussed above. For a given signal conductor, there will be a shielding conductor immediately above it (or below it) and a shielding conductors on either side (or both sides) of it.

In order to reduce the space used, the conductors may be minimum width. However, to decrease the resistance of the interconnect, the conductors may be widened as desired (or as space allows) to obtain the required improvement in performance. As shown in FIG. 11, there may be greater spacing between some of the conductors (e.g., conductors 1140 and 1145 and conductors 1150 and 1155) to allow room to make contacts to the desired conductors.

As discussed above, the above techniques of signal line shielding may be used to improve the performance the interconnect lines. There are other techniques that may be used to further improve performance, and these techniques may be combined with what is described above.

Figure 12:
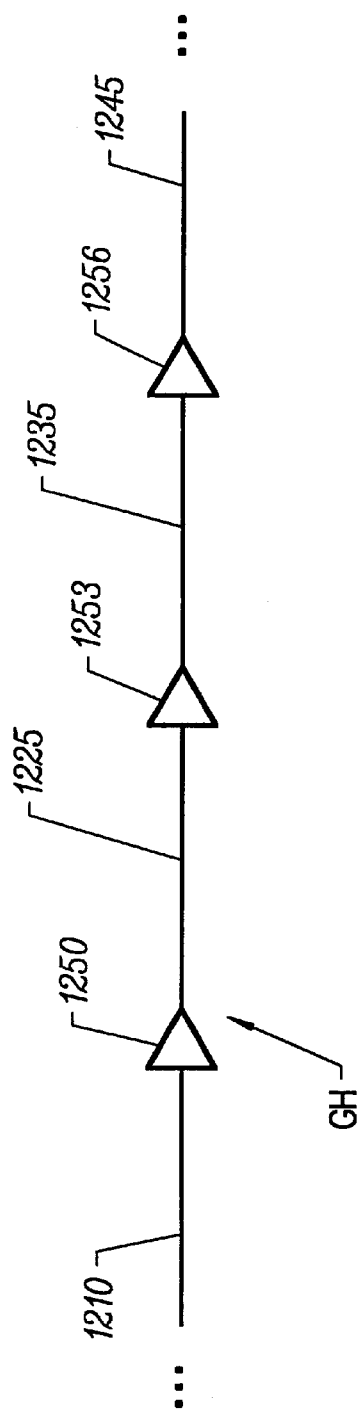
FIG. 12 shows a segmented interconnect line.

Performance of interconnect lines may also be improved using, for example, line segmentation. FIG. 12 shows an embodiment of line segmentation where a GH line has been segmented into four segments 1210, 1225, 1235, and 1245. Other signal lines in a group of interconnect lines may also be run using line segmentation. Or, a selected signal lines such as a clock line may use line segmentation while other lines are not segmented.

Between the segments are buffers 1250, 1253, and 1256. The buffers may be unidirectional or bidirectional depending on the type of interconnect being implemented. As an example, for a GH line, bidirectional buffering may be used. The buffers may also include tristatcability.

Interconnect performance is improved using line segmentation for reasons including the availability of greater drive capability to counteract the parasitic capacitances and capacitive coupling between signal lines.

Figure 13:
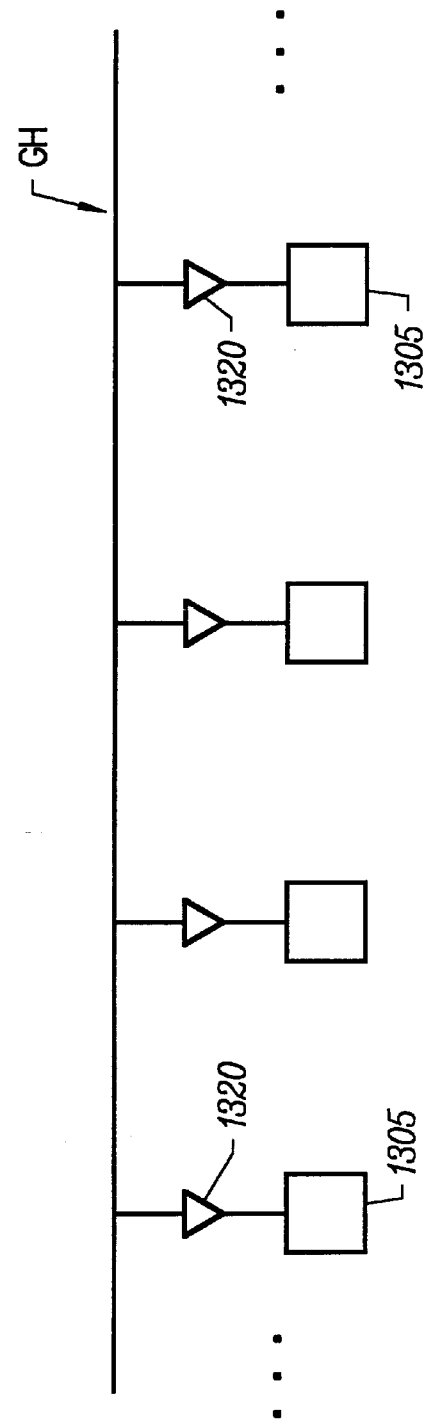
FIG. 13 shows an implementation of glitch filtering for an interconnect line.

Another technique to improve the performance of interconnect lines is to minimize the possibility of logical errors by filtering any glitch due to crosstalk noise. For example, FIG. 13 shows a diagram of a GH line which is used to couple a signal to various circuitry 1305 (e.g., LABs and LEs) on the integrated circuit. Signals from the GH line are filtered using a glitch filter 1320 at the input to circuitry 1305. This glitch filter may be implemented using a buffer with hysteresis such as a Schmitt trigger circuit.

Figure 14:
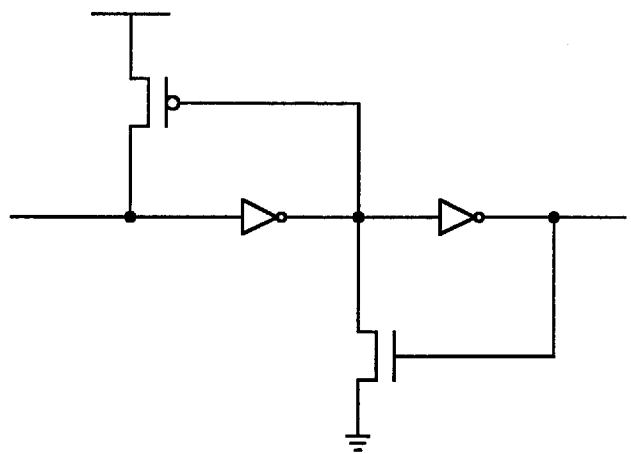
FIG. 14 shows an implementation of a glitch filtering buffer.
Figure 15:
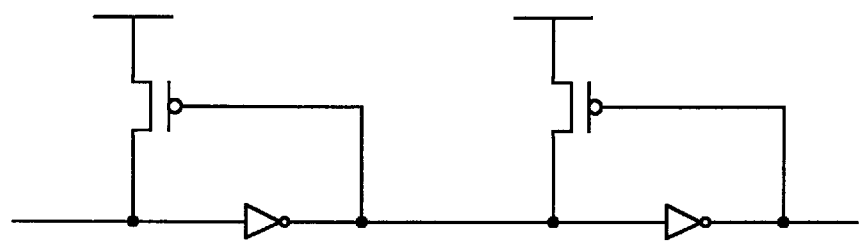
FIG. 15 shows a further embodiment of a glitch filtering buffer.
Figure 16:
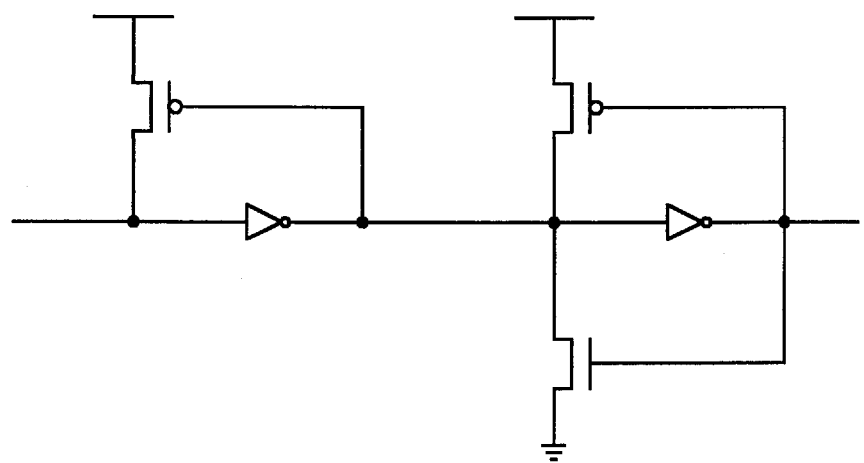
FIG. 16 shows another embodiment of a glitch filtering buffer.

FIGS. 14, 15, and 16 show various examples of embodiment of buffers having hysteresis. The circuitry in FIG. 16 provides more degrees of freedom, but it requires one extra transistor. The circuit implementations in FIGS. 14, 15, and 16 may be used to implement buffer or glitch filter 1320.

Glitch filtering is especially useful for a clock line, for example, because the glitch filter will help prevent double clocking. The input threshold for the glitch filter may be adjusted so that a glitch from crosstalk noise does not propagate though the filter (so the glitch will not be mistaken as an additional clock edge). Glitch filtering may also be used on signal lines other than clock lines to reduce logic errors.

If the receiving buffer 1320 is designed to include voltage hysteresis, crosstalk noise would be suppressed. One way to ensure noise suppression would be to design a buffer with a hysteresis which is either equal to or greater than the maximum glitch size observed on a given line.

It would be sufficient, however, to make this hysteresis equal to the maximum glitch size observed in the desired hysteresis window. Even though the larger glitches are observed on the line they will be filtered out because they are not in the buffer's hysteresis window.

This detailed description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize and practice the invention in various embodiments and with various modifications as are suited to the particular use contemplated. It is intended that the scope of the invention be defined by the following claims.

What is claimed is:

1. A programmable logic integrated circuit comprising:
   a first level of conductors comprising a first conductor and a second programmable interconnect conductor, and a first space between the first and second conductors; and
   a second level of conductors comprising a third programmable interconnect conductor, a shielding conductor, and a fourth programmable interconnect conductor, and a second space between the third programmable interconnect and shielding conductors and a third space between the shielding and fourth programmable interconnect conductors, wherein the shielding conductor is above the second programmable interconnect conductor, and the third programmable interconnect conductor is above the first space.

2. The integrated circuit of claim 1 wherein the second space is above the second programmable interconnect conductor.

3. The integrated circuit of claim 1 wherein a pitch of the first space plus the second programmable interconnect conductor is about the same as the third programmable interconnect conductor plus the second space plus the shielding conductor plus the third space.

4. The integrated circuit of claim 1 wherein a first pitch in the first level comprises the first space plus the second conductor, and the first pitch is repeated in the first level at least one additional time.

5. The integrated circuit of claim 1 wherein a second pitch in the second level comprises the third programmable interconnect conductor plus the second space plus the shielding conductor plus the third space, and the second pitch is repeated in the second level at least one additional time.

6. The integrated circuit of claim 1 wherein a first pitch in the first level comprises the first space plus the second conductor, and the first pitch is repeated in the first level at least one additional time, and a second pitch in the second level comprises the third programmable interconnect plus the second space plus the shielding conductor plus the third space, and the second pitch is repeated in the second level at least one additional time.

7. The integrated circuit of claim 6 wherein the first pitch is approximately the same width as the second pitch.

8. The integrated circuit of claim 1 wherein the conductors in the first and second levels comprise copper.

9. The integrated circuit of claim 1 wherein a dielectric layer between the first and second levels comprises a low k dielectric.

10. The integrated circuit of claim 1 wherein a layer between the first and second levels comprises a dielectric material with a k value less than that for silicon dioxide.

11. The integrated circuit of claim 1 wherein the shielding conductor is coupled to a fixed voltage potential.

12. The integrated circuit of claim 1 wherein the shielding conductor is coupled to ground.

13. The integrated circuit of claim 1 wherein the second conductor may be programmably coupled to a logic block of the programmable logic integrated circuit to conduct a logic signal.

14. The integrated circuit of claim 1 wherein the third conductor may be programmably coupled to a logic block of the programmable logic integrated circuit to conduct a logic signal.

15. The integrated circuit of claim 1 wherein the third conductor may be programmably coupled to a logic block of programmable logic integrated circuit to conduct a logic signal, and the shielding conductor is coupled to a fixed voltage potential.

16. A programmable logic integrated circuit comprising:
   a first level of conductors comprising a first conductor and a second programmable interconnect conductor, and a first space between the first and second conductors; and
   a second level of conductors comprising a third programmable interconnect conductor, a shielding conductor, and a fourth programmable interconnect conductor, and a second space between the third programmable interconnect and shielding conductors and a third space between the shielding and fourth programmable interconnect conductors, wherein the shielding conductor is above the second programmable interconnect conductor and the third programmable interconnect conductor is above the first space, the conductors in the first and second levels comprise copper, and a layer between the first and second levels comprises a dielectric material with k value less than that for silicon dioxide.

17. The integrated circuit of claim 16 wherein the third conductor may be programmably coupled to a logic block of the programmable logic integrated circuit to conduct a logic signal.

18. The integrated circuit of claim 16 wherein the third conductor may be programmably coupled to a logic block of the programmable logic integrated circuit to conduct a logic signal, and the shielding conductor is coupled to a fixed voltage potential.

19. The integrated circuit of claim 16 wherein a first pitch in the first level comprises the first space plus the second conductor, and the first pitch is repeated in the first level at least one additional time, wherein a second pitch in the second level comprises the third programmable interconnect conductor plus the second space plus the shielding conductor plus the third space, and the second pitch is repeated in the second level at least one additional time.

20. The integrated circuit of claim 1 wherein the first level conductors are run in metal-3 and the second level conductors are run in metal-4.

21. The integrated circuit of claim 16 wherein the first level conductors are run in metal-3 and the second level conductors are run in metal-4.

22. The integrated circuit of claim 1 wherein there is no metal layer between the first and second levels.

23. The integrated circuit of claim 16 wherein there is no metal layer between the first and second levels.

24. A programmable logic integrated circuit comprising:
   a first level of conductors comprising a first programmable interconnect conductor, a shielding conductor, and a second programmable interconnect conductor, and a first space between the first programmable interconnect and shielding conductor, and a second space between the shielding and second programmable interconnect conductors; and
   a second level of conductors comprising a third conductor and a fourth programmable interconnect conductor, and a third space between the third and fourth programmable interconnect conductors, wherein the shielding conductor is below the fourth programmable interconnect conductor and the first programmable interconnect conductor is below the third space.

25. The integrated circuit of claim 24 wherein a pitch of the first programmable interconnect conductor plus the first space plus the shielding conductor plus the second space is about the same as the third space plus the fourth programmable interconnect conductor.

26. The integrated circuit of claim 24 wherein the conductors in the first and second levels comprise copper.

27. The integrated circuit of claim 24 wherein a dielectric layer between the first and second levels comprises a dielectric material with a k value less than that for silicon dioxide.

28. The integrated circuit of claim 24 wherein the first, second, and fourth conductors may be programmably coupled to a logic block of the programmable logic integrated circuit to conduct a logic signal.

29. The integrated circuit of claim 28 wherein the conductors in the first and second levels comprise copper.

30. An integrated circuit comprising:
a first layer comprising a first conductor, a first space, a second conductor, and a second space, formed adjacent another;
a second layer comprising a third conductor, a third space, a fourth conductor, and a fourth space, formed adjacent another, wherein widths of the first and third conductors are about equal, widths of the second and fourth conductors are about equal, the first and fourth conductors are shielding conductors, the second and third conductors are signal conductors, and the second space is wider than the first space.

31. The integrated circuit of claim 30 wherein the fourth space is wider than the third space.

32. The integrated circuit of claim 30 wherein the first conductor is above the third conductor, the first space is above the third space, the second conductor is above the fourth conductor, and the second space is above the fourth space.

33. The integrated circuit of claim 30 wherein the conductors comprise copper.

34. The integrated circuit of claim 30 wherein the third conductor is above the first conductor, the third space is above the first space, the fourth conductor is above the second conductor, and the fourth space is above the second space.

35. The integrated circuit of claim 30 wherein a pitch of the first conductor plus the first space plus the second conductor plus the second space is about the same as the third conductor plus the third space plus the fourth conductor plus the fourth space.

36. The integrated circuit of claim 30 wherein the integrated circuit is a programmable logic device.

37. The integrated circuit of claim 30 wherein the integrated circuit is a programmable logic integrated circuit, and the first and fourth conductors may be programmably coupled to logic blocks of the programmable logic integrated circuit and the second and third conductors are shielding conductors.

38. The integrated circuit of claim 37 wherein the shielding conductors are coupled to a fixed potential.

39. The integrated circuit of claim 37 wherein the conductors comprise copper.

40. A programmable logic integrated circuit comprising:
a first layer comprising a first signal conductor, a first space, a first shielding conductor, a second space, and a second signal conductor, adjacent another; and
a second layer comprising a third signal conductor, a third space, a second shielding conductor, a fourth space, and a fourth signal conductor, adjacent another, wherein the conductors in the first layer are arranged and sized with respect to the conductors in second layer so the first and fourth signal conductors are not directly above or below the third or fourth signal conductors, or any other signal conductors of the second layer.

41. The integrated circuit of claim 40 wherein the fourth signal conductor is above or below the first shielding conductor.

42. The integrated circuit of claim 40 wherein a width of the first and second signal conductors is different from a width of the third signal conductor.

43. The integrated circuit of claim 40 wherein the signal conductors are programmably coupled to logic blocks of the programmable logic integrated circuit, and the shielding conductors are coupled to a fixed voltage potential.

44. The integrated circuit of claim 40 wherein the conductors comprise copper.

45. The integrated circuit of claim 40 wherein the first shielding conductor is above or below one of the signal conductors.

46. The integrated circuit of claim 40 wherein the second shielding conductor is above or below one of the signal conductors.

47. The integrated circuit of claim 45 wherein the second shielding conductor is above or below one of the signal conductors.

48. The integrated circuit of claim 45 wherein the conductors comprise copper.

* * * * *